(12) United States Patent
Moriwaki

(10) Patent No.: US 8,446,010 B2
(45) Date of Patent: May 21, 2013

(54) MULTILAYER WIRING, SEMICONDUCTOR DEVICE, SUBSTRATE FOR DISPLAY DEVICE, AND DISPLAY DEVICE

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 295 days.

(21) Appl. No.: 12/988,588

(22) PCT Filed: Dec. 12, 2008

(86) PCT No.: PCT/JP2008/072665
§ 371 (c)(1),
(2), (4) Date: Oct. 19, 2010

(87) PCT Pub. No.: WO2009/130822
PCT Pub. Date: Oct. 29, 2009

(65) Prior Publication Data
US 2011/0037072 A1  Feb. 17, 2011

(30) Foreign Application Priority Data

Apr. 25, 2008 (JP) ................................. 2008-116177

(51) Int. Cl.
*H01L 23/48* (2006.01)
*H01L 23/52* (2006.01)
*H01L 29/40* (2006.01)

(52) U.S. Cl.
USPC ............ 257/758; 257/E29.151; 257/E29.273; 257/E29.29; 257/57; 438/622; 438/618; 438/151

(58) Field of Classification Search
USPC .................... 438/622, 618, 151; 257/57, 758, 257/E29.151, E29.273, E29.29
See application file for complete search history.

(56) References Cited

U.S. PATENT DOCUMENTS

2005/0098894 A1* 5/2005 Ohtani et al. ................. 257/758
2007/0077672 A1* 4/2007 Kang et al. ...................... 438/30

FOREIGN PATENT DOCUMENTS

| JP | 11-008196 | 1/1999 |
|----|-----------|--------|
| JP | 2000-002890 | 1/2000 |
| JP | 2002-110988 | 4/2002 |
| JP | 2005-072573 | 3/2005 |
| JP | 2006-332603 | 12/2006 |
| JP | 2007-005583 | 1/2007 |
| JP | 2007-043118 | 2/2007 |

OTHER PUBLICATIONS

International Search Report for PCT/JP2008/072665, mailed Dec. 12, 2008.

* cited by examiner

*Primary Examiner* — Michael Lebentritt
*Assistant Examiner* — Aaron Dehne
(74) *Attorney, Agent, or Firm* — Nixon & Vanderhye P.C.

(57) ABSTRACT

The present invention provides a multilayer wiring capable of reducing the area of the wiring layer while preventing the property deterioration due to the parasitic capacitance, a semiconductor device, a substrate for display device, and a display device. The multilayer wiring of the present invention includes: a first conductor; a second conductor; and a third conductor. The first conductor is positioned in a (n+1)th conductive layer. The second conductor is positioned in a (n+2)th conductive layer, is electrically connected to a conductor in a layer below the (n+1)th conductive layer through at least a first connection hole in a (n+1)th insulating layer directly below the (n+2)th conductive layer, and is positioned so as not to overlap with the first conductor in a plan view of the main face of the substrate. The third conductor is positioned in a (n+3)th conductive layer, is electrically connected to a second conductor through a second connection hole in a (n+2)th insulating layer directly below the (n+3)th conductive layer, and is positioned on the second connection hole toward the first conductor. The second connection hole overlaps with the first connection hole in a plan view of the main face of the substrate.

10 Claims, 4 Drawing Sheets

MULTILAYER WIRING, SEMICONDUCTOR DEVICE, SUBSTRATE FOR DISPLAY DEVICE, AND DISPLAY DEVICE

This application is the U.S. national phase of International Application No. PCT/JP2008/072665 filed 12 Dec. 2008, which designated the U.S. and claims priority to JP Application No. 2008-116177 filed 25 Apr. 2008, the entire contents of each of which are hereby incorporated by reference.

TECHNICAL FIELD

The present invention relates to a multilayer wiring, a semiconductor device, a substrate for display device, and a display device. More specifically, the present invention relates to a multilayer wiring, a semiconductor device, a substrate for display device, and a display device, which are suitably used in mobile devices such as mobile phones.

BACKGROUND ART

Recently, downsizing and weight saving are further demanded with respect to mobile electronic devices, such as mobile phones and PDA, on which display devices including liquid crystal display devices and organic electroluminescence displays are mounted. Along with this trend, downsizing of a non-opening part in a substrate for display device included in the display device, namely, frame narrowing of the substrate for display device has been developed.

Further, since a thinner device can be obtained at reduced cost, display devices equipped with full-monolithic substrates for display device are increasing, the full-monolithic substrates comprising peripheral circuits required for driving, such as driver circuits, formed thereon. In the display device equipped with a full-monolithic substrate for display device, a pixel-driving circuit formed on the substrate for display device increases a region for peripheral circuits (frame region). To overcome this, a multilayer wiring in which a wiring included in the peripheral circuit is routed in a multi-layer structure has been developed so as to facilitate the frame narrowing.

The configuration of a conventional substrate for display device is described with reference to a drawing. FIG. 2 is a schematic cross-sectional view illustrating a conventional substrate for display device.

As illustrated in FIG. 2, a conventional substrate 1100a for display device comprises: a semiconductor layer 1102 including a channel region 1102a and high-concentration impurity regions 1102b, 1102c; a gate insulating layer 1103; a wiring layer 1121; an interlayer insulating layer 1131 including contact holes 1141a, 1141b; a wiring layer 1122; an interlayer insulating layer 1132 including a through hole 1142; a wiring layer 1123; an interlayer insulating layer 1133 including a through hole 1143; and a pixel electrode 1105, laminated in this order on a main face of a substrate 1101. In addition, the substrate 1100a for display device is equipped with a pixel transistor 1110 that is a top-gate type (planer type) thin-film transistor (TFT) comprising the semiconductor layer 1102, the gate insulator 1103, and a gate electrode 1104 formed on the channel region 1102a in the wiring layer 1121.

The contact hole 1141a is a connection hole penetrating the interlayer insulating layer 1131 and the gate insulating layer 1103 to electrically connect a lower connection wiring (lower wiring) 1107 positioned in a wiring layer 1122 to the high-concentration impurity region 1102b. The contact hole 1141b is a connection hole provided for electrically connecting a source wiring 1106 positioned in the wiring layer 1122 to the high-concentration impurity regions 1102c. The through hole 1142 is a connection hole penetrating the interlayer insulating layer 1132 to electrically connect an upper connection wiring (upper wiring) 1108 positioned in the wiring layer 1123 to the lower connection wiring 1107. Further, the through hole 1143 is a connection hole penetrating the interlayer insulating layer 1133 to electrically connect the pixel electrode 1105 to the upper connection wiring 1108.

The technical art for providing a wiring substrate having a small and high-performance functional circuit, in which the multilayer wiring can be formed in few processes; and a semiconductor device includes a wiring substrate comprising: a first wiring formed on a substrate having an insulating surface; a first interlayer insulating layer covering the first wiring; a second wiring formed on the first interlayer insulating layer; a second interlayer insulating layer covering the second wiring; a third wiring formed on the second interlayer insulating layer; a first contact hole formed in the first interlayer insulating layer to electrically connect the first wiring to the second wiring; and a second contact hole formed in the second interlayer insulating layer to electrically connect the second wiring to the third wiring, wherein the third wiring is wider than the first and second wirings, the second wiring is wider than the first wiring, and the diameter or area of the second contact hole is larger than that of the first contact hole (see Patent Document 1, for example).
[Patent Document 1]
  JP-A 2005-72573

DISCLOSURE OF INVENTION

In the conventional substrate 1100a for display device illustrated in FIG. 2, the lower connection wiring 1107 and the upper connection wiring 1108 are laminated outward from the pixel transistor 1110. Since the area of the wiring layer is large in this configuration, the area of a non-opening part h is large, resulting in a low aperture ratio that has to be improved.

To solve the above problem, laminating the lower connection wiring 1107 and the upper connection wiring 1108 above the pixel transistor 1110 can be proposed. One modification of the conventional substrate for display device is described with reference to a drawing. FIG. 3 is a schematic cross-sectional view illustrating a modification of the conventional substrate for display device. It is to be noted that, in FIG. 3, numbers are allocated only to the members used in the description.

In a substrate 1100b for display device, which is a modification of the conventional substrate for display device, as illustrated in FIG. 3, the connecting portion of the lower connection wiring 1107 and the upper connection wiring 1108 through the through hole 1142 is positioned above the gate electrode 1104. Accordingly, the lower connection wiring 1107 and the upper connection wiring 1108 are laminated above the pixel transistor 1110. In this manner, the area of the wiring layer is reduced so that the area of the non-opening part h is reduced. As a result, the aperture ratio is improved.

However, in such an embodiment, the area of the overlapping region of the lower connection wiring 1107 and the gate electrode 1104 is large. In addition, since the interlayer insulating layer 1131 is comparatively thinly formed, large parasitic capacitance is generated between the lower connection wiring 1107 and the gate electrode 1104. This may cause property deterioration due to the parasitic capacitance such as signal delay in the wiring, inappropriate signal voltage, and increase in power consumption, which have to be improved.

Moreover, the technical art disclosed in Patent Document 1 fails to form a fine wiring pattern in the upper wiring. As a result, the area of the wiring layer is increased, which has to be improved.

The present invention has been made in view of the above-mentioned state of the art. The present invention has an object to provide a multilayer wiring capable of reducing the area of the wiring layer while preventing the property deterioration due to the parasitic capacitance, a semiconductor device, a, substrate for display device, and a display device.

The present inventors made various investigations on a multilayer wiring capable of reducing the area of the wiring layer while preventing property deterioration due to the parasitic capacitance, a semiconductor device, a substrate for display device, and a display device. Here, the present inventors focused on the configuration of the multilayered wiring layer. Then, the present inventors found the following. In an embodiment where a conductor, a first insulating layer, a first conductor, a second insulating layer, a second conductor, a third insulating layer, and a third conductor are laminated in this order on a substrate (each layer may be a laminated body comprising a plurality of layers), a first connection hole formed in the first and second insulating layers for electrically connecting the conductor and the second conductor and a second connection hole formed in the third insulating layer for electrically connecting the second and third conductors are to be arranged so as to overlap to each other. This can reduce the area of the wiring layer. In addition, the non-overlapping arrangement of the first and second conductors can prevent the increase in the parasitic capacitance. Further, since the second and third insulating layers are provided between the first and third conductors, the increase of the parasitic capacitance between the first and third conductors can be surely avoided. The third conductor positioned on the second connection hole toward the direction of the first conductor can prevent the increase in the parasitic capacitance and reduce the area of the wiring layer. Based on the above findings, the present inventors arrived at solving the above-mentioned problems, leading to the completion of the present invention.

Namely, the present invention provides a multilayer wiring comprising: a plurality of insulating layers each having a connection hole; a plurality of conductive layers; and a substrate having the plurality of insulating layers and the plurality of conductive layers alternately laminated on a main face of the substrate, wherein the multilayer wiring includes: a first conductor positioned in a $(n+1)$th conductive layer laminated on the substrate; a second conductor positioned in a $(n+2)$th conductive layer laminated on the substrate, electrically connected to a conductor in a layer below the $(n+1)$th conductive layer through at least a first connection hole in a $(n+1)$th insulating layer directly below the $(n+2)$th conductive layer, and positioned so as not to overlap with the first conductor in a plan view of the main face of the substrate; and a third conductor positioned in a $(n+3)$th conductive layer laminated on the substrate, electrically connected to a second conductor through a second connection hole in a $(n+2)$th insulating layer directly below the $(n+3)$th conductive layer, and positioned on the second connection hole toward the first conductor, the second connection hole overlapping with the first connection hole in a plan view of the main face of the substrate, n referring to an arbitrary natural number. Accordingly, the second connection hole overlapping with the first connection hole can reduce the area of the wiring layer. In addition, the second conductor not overlapping with the first conductor and the third conductor positioned on the second connection hole toward the direction of the first conductor can suppress the parasitic capacitance and further reduce the area of the wiring layer. As a result, it is possible to further reduce the area of the wiring layer while preventing property deterioration due to the parasitic capacitance, such as signal delay in the wiring, inappropriate signal writing, and increase in power consumption. Here, there is a concern about the parasitic capacitance between the first conductor and the third conductor positioned on the second connection hole toward the direction of the first conductor in a plan view of the main face of the substrate. However, in the multilayer wiring of the present invention, the $(n+2)$th and $(n+1)$th insulating layers are laminated between the third conductor and the first conductor, and therefore, it becomes possible to suppress the parasitic capacitance between the third and first conductors, compared to the conventional one.

The configuration of the multilayer wiring of the present invention is not especially limited as long as it essentially includes such components. The multilayer structure may or may not include other components.

Hereinafter, the present invention is specifically described.

The materials of the conductors are not especially limited as long as they are electrically conductive, and the conductors may be a metal, or a semiconductor added with an impurity. In addition, the conductors may have laminated structures comprising various materials. Accordingly, the conductors may be wirings, or alternatively, source-drain regions of MOS transistors.

The insulating layers are not especially limited as long as they comprise insulating materials. They may be gate insulating layers of MOS transistors, or alternatively, interlayer insulating layers provided between the upper and lower wiring layers. Further, they may have laminated structures comprising various materials.

In the present description, a natural number refers to a positive integer not including zero. Namely, n refers to an integer equal to or larger than 1 in the present description.

In the present description, the connection hole is a hole provided for electrically connecting the conductor in the layer on the insulating layer in which the connection hole is provided to the conductor in the layer directly below the insulating layer. Further, the connection hole may be a through hole (via hole) for electrically connecting the wiring in the layer on the interlayer insulating layer, in which that connection hole is provided, to the wiring in the layer below the interlayer insulating layer. Or alternatively, the connection hole may be a contact hole for electrically connecting the wiring in the layer on the interlayer insulating layer, in which that connection hole is provided, to the source-drain region of the MOS transistor in the layer below the interlayer insulating layer. Here, the direction indicated by "on/above" refers to the direction away from the substrate and the direction indicated by "below" refers to the direction closer to the substrate in the present description.

In the present description, the state where the second conductor is not overlapping with the first conductor in a plan view of the main face of the substrate preferably refers to a state where the second conductor is not at all overlapping with the first conductor in a plan view of the main face of the substrate. However, the state may refer to a state where at least the second conductor is substantially not overlapping with the first conductor in a plan view of the main face of the substrate. Namely, the second conductor and the first conductor may be overlapping with each other, in a plan view of the main face of the substrate, to the extent that causes no property deterioration due to the parasitic capacitance.

In the present description, the state where the second connection hole is overlapping with the first connection hole in a plan view of the main face of the substrate preferably refers to a state where the entire first connection hole is overlapping with the second connection hole in a plan view of the main face of the substrate. However, the state may refer to a state where the second connection hole is substantially overlapping with the first connection hole in a plan view of the main face of the substrate. Moreover, the state may refer to a state where at least a part of the first connection hole is overlapping with the second connection hole in a plan view of the main face of the substrate.

The third conductor may be overlapping with the first conductor in a plan view of the main face of the substrate. This can further reduce the area of the wiring layer.

The third conductor may not be overlapping with the first conductor in a plan view of the main face of the substrate. This can further suppress the parasitic capacitance (fringing capacitance) between the third and first conductors, leading to further prevention of the property deterioration due to the parasitic capacitance.

The multilayer wiring preferably comprises a fourth conductor positioned in a (n+4)th conductive layer laminated on the substrate and electrically connected to the third conductor through the third connection hole provided in the (n+3)th insulating layer directly below the (n+4)th conductive layer at the position on the first conductor side of the second connection hole in a plan view of the main face of the substrate. This enables further lamination of conductive layers while securing the above-mentioned effects. In a case where the (n+3)th insulating layer is not flat, inappropriate patterning of the (n+3)th insulating layer may leave residues thereof in the third connection hole, resulting in contact failure that the third conductor is not electrically connected to the fourth conductor. In order to prevent such a contact failure, it is preferable that the third connection hole is not overlapping with the second connection hole in a plan view of the main face of the substrate.

The overlapping area of the third and first conductors in a plan view of the main face of the substrate is not especially limited as long as it is within the range where the above-mentioned effects can be secured. In an embodiment where the fourth conductor is provided, the overlapping area preferably has a size capable of arranging at least a part of the third connection hole therein. More preferably, the overlapping area has a size capable of arranging the entire third connection hole therein in a plan view of the main face of the substrate.

The multilayer wiring may comprise the first and third conductors which have different electric potentials. As above described, the multilayer wiring of the present invention is suitably used in a case where the parasitic capacitance is generated between the first and third conductors.

The present invention also provides a semiconductor device comprising the multilayer wiring of the present invention and a MOS transistor, wherein the first conductor is a gate electrode of the MOS transistor; the second conductor is a lower wiring electrically connected to a source drain region of the MOS transistor through a first connection hole, the source drain region positioned below the gate electrode; and the third conductor is an upper wiring electrically connected to a lower wiring through a second connection hole. The semiconductor device of the present invention is provided with the multilayer wiring that reduces the area of the wiring layer while preventing property deterioration due to the parasitic capacitance. Therefore, it is possible to obtain a compact and high-performance semiconductor device that is less likely to have signal delay in the wiring and inappropriate signal writing and is excellent in power conservation.

The configuration of the semiconductor device of the present invention is not especially limited as long as it essentially includes such components. The semiconductor device may or may not include other components.

The MOS transistor may be formed in an integrated circuit. This allows down-sizing of the integrated circuit while preventing property deterioration due to the parasitic capacitance. Therefore, it is possible to obtain a high-performance semiconductor device comprising the integrated circuit with higher integration degree, which is less likely to have signal delay in the wiring and inappropriate signal writing and is excellent in power conservation.

The present invention also provides a substrate for display device comprising the semiconductor device of the present invention, wherein the MOS transistor is a thin film transistor to be used in a pixel portion. This narrows the non-opening part of the pixel portion to increase the aperture ratio while preventing property deterioration due to the parasitic capacitance.

The present invention also provides a substrate for display device comprising the semiconductor device of the present invention, wherein the MOS transistor is a thin film transistor to be used in a peripheral circuit portion. This narrows the peripheral circuit portion to achieve frame narrowing while preventing property deterioration due to the parasitic capacitance. Accordingly, the substrate for display device of the present invention is suitably used as the full-monolithic substrate for display device, on which peripheral circuits such as a power circuit necessary for driving the display device and a driver are formed.

The present invention also provides a display device comprising the semiconductor device of the present invention or the substrate for display device of the present invention. The semiconductor device or substrate for display device of the present invention can improve the aperture ratio of the display device to narrow the frame portion of the display device, while preventing property deterioration due to the parasitic capacitance. Therefore, the semiconductor device of the present invention or a display device, such as a liquid crystal display device and an organic electroluminescence display, comprising the substrate for display device of the present invention can be suitably used in mobile devices such as a mobile phone.

EFFECT OF THE INVENTION

According to the present invention, it is possible to provide a multilayer wiring capable of reducing the area of the wiring layer while preventing the property deterioration due to the parasitic capacitance, a semiconductor device, a substrate for display device and a display device.

BEST MODE FOR CARRYING OUT THE INVENTION

Embodiments of the present invention are specifically described in the following with reference to the drawings. Here, it is to be noted that the present invention is not limited to these embodiments.

Embodiment 1

FIG. 1 are schematic views each illustrating a substrate for display device of Embodiment 1. FIG. 1(a) is a plan view of the substrate and FIG. 1(b) is a cross-sectional view of the substrate taken along X1-Y1 line in FIG. 1(a).

A substrate 100 for display device of Embodiment 1 is to be used in a display device such as a liquid crystal display device. As illustrated in FIGS. 1(a) and 1(b), the substrate 100 for display device comprises a semiconductor layer 102, a gate insulating layer 103, a wiring layer 121, an interlayer insulating layer 131, a wiring layer 122, an interlayer insulating layer 132, a wiring layer 123, an interlayer insulating layer 133, and a pixel electrode 105 laminated in this order on a main face of a substrate 101. The semiconductor layer 102 is a first conductor layer laminated on the substrate 101, and comprises a channel region 102a and high-concentration impurity regions 102b, 102c. The gate insulating layer 103 is a first insulating layer laminated on the substrate 101. The wiring layer 121 is a second conductive layer laminated on the substrate 101. The interlayer insulating layer 131 is a second insulating layer laminated on the substrate 101 and comprises contact holes 141a and 141b. The wiring layer 122 is a third conductive layer laminated on the substrate 101. The interlayer insulating layer 132 is a third insulating layer laminated on the substrate 101 and comprises a through hole 142. The wiring layer 123 is a fourth conductive layer laminated on the substrate. The interlayer insulating layer 133 is a fourth insulating layer laminated on the substrate and comprises a through hole 143. The pixel electrode 105 is a fifth conductive layer laminated on the substrate 101.

The substrate 100 for display device comprises a pixel transistor 110 that is a top-gate type (planer type) TFT including the semiconductor layer 102, the gate insulating layer 103, and the gate electrode 104 formed on the channel region 102a in the wiring layer 121. As above, the pixel transistor 110 has a single-drain structure. In addition, to reduce the off-state current, the pixel transistor 110 may have a LDD (lightly Doped Drain) structure or GOLD (Gate Overlapped LDD) structure.

The wiring layer 121 comprises the gate electrode 104 and the gate wiring 109. The gate electrode 104 corresponds to the first conductor of the present invention in the substrate 100 for display device. The gate electrode 104 is electrically connected to the gate wiring 109 and a part of the gate wiring 109 functions as the gate electrode 104. As above, the gate electrode 104 and the gate wiring 109 are integrally formed in the wiring layer 121. The gate electrode 104 has a width of about 2 to 5 µm (preferably 3 to 4 µm) in the direction along the channel length. The gate wiring 109 has a width of about 5 to 15 µm (preferably 6 to 10 µm).

In the substrate 100 for display device, the gate electrode 104 in the wiring layer 121 is in the region overlapping the channel region 102a included in the pixel transistor 110. In addition, the gate wiring 109 is for transmitting a scanning signal and may be called a gate line, scanning line, or scanning signal line.

The wiring layer 122 comprises a lower connection wiring (lower wiring) 107 and a source wiring 106. The lower connection wiring 107 corresponds to the second conductor of the present invention in the substrate 100 for display device. The lower connection wiring 107 is electrically connected to a drain region (high-concentration impurity region 102b) in the pixel transistor 110 through a contact hole 141a. The source wiring 106 is electrically connected to a source region (high-concentration impurity region 102c) in the pixel transistor 110 through a contact hole 141b.

The wiring layer 123 comprises an upper connection wiring (upper wiring) 108. The upper connection wiring 108 corresponds to the third conductor of the present invention in the substrate 100 for display device. The upper connection wiring 108 is electrically connected to the drain region (high-concentration impurity region 102b) in the pixel transistor 110 through a through hole 142 and the lower connection wiring 107.

The pixel electrode 105 corresponds to the fourth conductor of the present invention in the substrate 100 for display device. The pixel electrode 105 is electrically connected to the drain region (high-concentration impurity region 102b) in the pixel transistor 110 through a through hole 143, the upper connection wiring 108, the through hole 142, and the lower connection wiring 107. Namely, the lower connection wiring 107 and the upper connection wiring 108 function as drain wirings for the pixel transistor 110.

The contact hole 141a is a connection hole penetrating the interlayer insulating layer 131 and the gate insulating layer 103 to electrically connect the lower connection wiring 107 to the high-concentration impurity region 102b. The contact hole 141b is a connection hole for electrically connecting the source wiring 106 to the high-concentration impurity region 102c. The through hole 142 is a connection hole penetrating the interlayer insulating layer 132 to electrically connect the upper connection wiring 108 to the lower connection wiring 107. The through hole 143 is a connection hole penetrating the interlayer insulating layer 133 to electrically connect the pixel electrode 105 to the upper connection wiring 108. In the substrate 100 for display device, the contact hole 141a corresponds to the first connection hole of the present invention, the through hole 142 corresponds to the second connection hole of the present invention, and the through hole 143 corresponds to the third connection hole of the present invention.

When the pixel transistor 110 is turned on, namely, when the channel region 102a is in the conductive state with voltage applied to the gate electrode 104, an image signal transmitted by the source wiring 106 passes through the pixel transistor 110 (channel region 102a and high-concentration impurity regions 102b, 102c), the lower connection wiring 107, and the upper connection wiring 108 in this order, and is stored in the pixel electrode 105 in the substrate 100 for display device. The image signal stored in the pixel electrode 105 is kept in the lower connection wiring 107 and the upper connection wiring 108, which are electrically connected to the pixel electrode 105, and in the pixel electrode 105 until the pixel transistor 110 is turned on again. Therefore, the electric potential of the gate electrode 104 is normally different from those of the lower connection wiring 107, the upper connection wiring 108, and the pixel electrode 105.

A production method of the substrate 100 for display device is described in the following.

First, a substrate 101 is prepared. The substrate 101 is preferably a transparent and/or insulating substrate. In the case where the substrate 100 for display device is used in a transparent liquid crystal display device, a transparent and, insulating substrate is preferable. The material thereof is not especially limited, and examples thereof include a glass substrate, a quarts substrate, a silicon substrate, a metal plate, a plastic substrate, a flexible organic substrate, and a substrate comprising a stainless steel plate with an insulation layer formed on its surface. Among these, a glass substrate is suitably used from a cost standpoint.

Next, an insular semiconductor layer 102 having a thickness of 30 to 100 nm (preferably 40 to 50 nm) is formed thereon. More specifically, an amorphous semiconductor film having an amorphous structure is formed by a known method (sputtering method, LPCVD method, plasma CVD method and the like) and the obtained film is crystallized by a known method (laser crystallization, heat crystallization, heat crystallization with use of a catalyst such as nickel) so as to produce a crystalline semiconductor film. The crystalline semiconductor film is patterned into a desired shape by photolithography. The semiconductor layer 102 is formed in this manner. The material of the semiconductor layer 102 is not especially limited and is preferably silicon, a silicon-germanium (SiGe) alloy, or the like.

An insulating layer comprising silicon (e.g. $SiO_2$ layer, SiN layer, SiNO layer) may be formed as a foundation layer on the substrate 101, prior to the formation of the semiconductor layer 102. This can prevent spread of impurities such as alkali metals from the substrate 101, while reducing the variation in the electrical property of the pixel transistor 110, even when a glass substrate is used as the substrate 101.

Next, a gate insulating layer 103 having a thickness of 30 to 100 nm (preferably 50 to 70 nm) is formed. An insulating layer comprising silicon (e.g. $SiO_2$ layer, SiN layer, SiNO layer) formed by the plasma CVD method or sputtering method, may be used as the gate insulating layer 103. The gate insulating layer 103 may have a monolayer structure or a structure comprising two or more insulating layers laminated therein. In particular, a $SiO_2$ layer is suitable as the gate insulating layer 103. In the case where the gate insulating layer 103 has a laminated structure, the layer contacting the semiconductor layer 102 is preferably a $SiO_2$ layer. This can lower the interface state between the gate insulating layer 103 and the semiconductor layer 102 (preferably a silicon layer), and therefore, the electrical property of the pixel transistor 110 can be improved.

Next, in order to control the threshold voltage of the pixel transistor 110, the entire surface of the semiconductor layer 102 is doped with impurity elements such as boron by ion implantation under the conditions of 50 kV, $5 \times 10^{12}$ to $3 \times 10^{13}$ $cm^{-2}$. The concentration of the impurity elements in the semiconductor layer 102 is to be about $5 \times 10^{16}$ to $5 \times 10^{17}$ $cm^{-3}$.

Next, a conductive film having a thickness of 200 to 600 nm (preferably 300 to 400 nm) is formed by sputtering method. The conductive film is patterned into a desired shape by photolithography so as to produce the wiring layer 121. As above, the gate electrode 104 and the gate wiring 109 are formed. The material of the wiring layer 121 is preferably a high-melting metal such as Ta, W, Ti, and Mo, or a metal alloy or compound mainly comprising a high-melting metal. Further, the compound mainly comprising a high-melting metal is preferably a nitride. Here, the wiring layer 121 may have a structure comprising conductive films formed with use of these materials laminated therein. In order to suppress an off leak current, the pixel transistor 110 may be a TFT having a dual-gate or triple-gate structure.

In addition, when making the pixel transistor 110 into LDD structure, the semiconductor layer 102 is doped with impurities such as phosphorus (P) self-aligningly by ion implantation at this timing, by using the wiring layer 121 as a mask under the conditions of 70 kV, $1 \times 10^{13}$ to $3 \times 10^{13}$ $cm^{-2}$ (low concentration doping). Moreover, the concentration of the impurity elements in the semiconductor layer 102 at this time is made about $1 \times 10^{13}$ to $3 \times 10^{13}$ $cm^{-3}$.

Next, the semiconductor layer 102 is doped with impurities such as phosphorus (P) self-aligningly by ion implantation, by using the wiring layer 121 as a mask under the conditions of 50 kV, $5 \times 10^{15}$ to $1 \times 10^{16}$ $cm^{-2}$ (high concentration doping). Moreover, the concentration of the impurity elements in the semiconductor layer 102 at this time is to be about $1 \times 10^{19}$ to $1 \times 10^{20}$ $cm^{-3}$. In this manner, the high-concentration impurity region 102b functioning as a drain region and the high-concentration impurity region 102c functioning as a source region are formed. In addition, when making the pixel transistor 110 into LDD structure, the low concentration impurity region which functions as a LDD region is formed by carrying out doping (high concentration doping) while masking the LDD region with a resist. Then, the resist is removed.

Next, the interlayer insulating layer 131 having a thickness of 0.5 to 1.5 μm (preferably 0.7 to 1.0 μm) is formed. The interlayer insulating layer 131 is preferably an inorganic insulating layer and an insulating layer comprising silicon (e.g. $SiO_2$ film, SiN film, SINO film) formed by plasma CVD method or sputtering method can be used. The interlayer insulating layer 131 may have a monolayer structure or a structure comprising two or more insulating layers laminated therein. In particular, the interlayer insulating layer 131 is preferably a laminated layer comprising a hydrogen-containing silicon nitride (SiN:H) film having a thickness of 0.2 to 0.4 μm and a $SiO_2$ film having a thickness of 0.4 to 0.6 μm laminated in this order on the wiring layer 121. After that, the whole substrate 101 including the members formed as described above is heated at 400 to 450° C. for 0.5 to 1.0 hour so that the semiconductor layer 102 is hydrogenated and activated. At this time, the hydrogen contained in the silicon nitride film is efficiently used to hydrogenate the semiconductor layer 102. Then, photolithography is carried out to the interlayer insulating film 131 and the gate insulating layer 103 so that the contact holes 141a and 141b are formed. In this processing, the high-concentration impurity regions 102b and 102c are partially exposed. The size of the contact holes 141a and 141b can be appropriately set and is normally 1 to 3 μm/side and preferably 2 μm/side when the planer shape (shape in a plan view of the main face of the substrate 101) of the contact holes 141a and 141b is substantially a square.

Next, a conductive film having a thickness of 400 to 1000 nm (Preferably 600 to 800 nm) is formed by sputtering method. Then, the conductive film is patterned into a desired shape by photolithography so as to produce the wiring layer 122. In this manner, the source wiring 106 and the lower connection wiring 107 are formed. Further, the source wiring 106 is electrically connected to the high-concentration impurity region 102c through the contact hole 141b and the lower connection wiring 107 is electrically connected to the high-concentration impurity region 102b through the contact hole 141a. At this time, the lower connection wiring 107 is arranged so as not to overlap with the gate electrode 104 in a plan view of the main face of the substrate 101. Since the heat treatment subsequent to the above processing is not needed, the wiring layer 122 can be formed with use of a low-melting material. Accordingly, a preferable material of the wiring layer 122 includes a low resistance metal such as aluminum (Al), titanium (Ti), molybdenum (Mo), copper (Cu), and silver (Ag), and a metal alloy or compound mainly comprising the low resistance metal. Here, the wiring layer 122 may have a laminated structure of the conductive films comprising these materials, and examples thereof include a structure in which a Ti layer, an Al layer, and a Ti layer are laminated in this order on the substrate 101. The conductive films are laminated in consideration of barrier performance of the upper wiring and the lower wiring, compatibility with etching, prevention of hillock, and prevention of migration.

Next, the interlayer insulating layer 132 having a thickness of 1.0 to 3.0 μm (preferably 1.5 to 2.5 μm) is formed. A material for insulating film is applied by spin coat method and the like and fired as appropriate so that the interlayer insulating layer 132 is formed. Preferable materials for the interlayer insulating layer 132 include resin materials and spin-on glass materials (SOG materials). Accordingly, the surface of the interlayer insulating layer 132 is planarized. The interlayer insulating layer 132 is preferably a planarizing film which conducts planarization. Examples of the resin materials include polyimide, acrylate, polyamide, polyimideamide, BCB (benzocyclobutene), and parylene. Among these, an acrylate resin and a photosensitive acrylate resin are preferable. It is to be noted that the SOG material refers to a material capable of forming a glass film (silica-based film) by an application method such as spin coat method. More specifically, preferable SOG materials include a Si—O—C bond or a Si—C bond as a skeleton. In addition, the resin material or SOG material preferably has photosensitivity. This allows formation of the connection hole (more specifically, through hole 142) only by exposure and development of the interlayer insulating layer 132 after its formation. Here, the interlayer insulating layer 132 may have a structure in which a plurality of insulating films comprising a resin material and/or a SOG material are laminated. Or alternatively, the interlayer insulating layer 132 may have a structure in which an insulating film (planarizing film) comprising at least one of a resin material and a SOG material, and an insulating film (e.g. inorganic insulating film) formed by CVD method, sputtering method or the like are laminated. More specifically, an insulating film (e.g. inorganic insulating film such as a $SiO_2$ film, a SiN film, and a SiNO film) may be formed on a planarizing film by CVD method or sputtering method in order to improve the adhesiveness of the wiring layer to be formed on the planarizing film and to protect the planarizing film in etching the wiring layer thereon. The interlayer insulating layer 132 is set to be thicker than the interlayer insulating layer 131. It is preferable that the surface of the interlayer insulating layer 132 is substantially flat. However, it may have level difference of about 500 nm (preferably 200 nm) or less in height. In the case where the interlayer insulating layer 132 has level difference on its surface, the curvature radius is preferably larger than the height of the level difference. This effectively prevents etch residues generated in etching for forming the upper wiring layer (more specifically, wiring layer 123).

After that, photolithography is carried out to the interlayer insulating layer 132 to form the through hole 142. Accordingly, the lower connection wiring 107 is partially exposed. At this time, the through hole 142 is arranged so as to overlap with the contact hole 141a in a plan view of the main face of the substrate 101. The size of the through hole 142 can be appropriately set and is normally 2 to 5 μm/side and preferably 4 μm/side when the planer shape (shape in a plan view of the main face of the substrate 101) of the through hole 142 is substantially a square.

Next, a conductive film having a thickness of 400 to 1000 nm (Preferably 600 to 800 nm) is formed by sputtering method. Then, the conductive film is patterned into a desired shape by photolithography so as to produce the wiring layer 123. In this manner, the upper connection wiring 108 is formed on the through hole 142 toward the gate electrode 104 and is electrically connected to the lower connection wiring 107 through the through hole 142. At this time, the upper connection wiring 108 is positioned so as to overlap with the gate electrode 104 with the interlayer insulating layer 132 and the interlayer insulating layer 131 interposed therebetween. As with the wiring layer 122, the wiring layer 123 may be formed with use of a low-melting material. Accordingly, a preferable material of the wiring layer 123 includes a low resistance metal such as Al, Ti, Mo, Cu, and Ag, and a metal alloy or compound mainly comprising these low resistance metals. Here, the wiring layer 123 may have a laminated structure of the conductive films comprising these materials, and examples thereof include a structure in which an Al layer and a Mo layer are laminated in this order on the substrate 101.

Next, the interlayer insulating layer 133 having a thickness of 1.0 to 3.0 μm (preferably 1.5 to 2.5 μm) is formed. A material for insulating film is applied by an application method such as spin coat method and fired as appropriate so that the interlayer insulating layer 133 is formed. As with the interlayer insulating layer 132, preferable materials for the interlayer insulating layer 133 include resin materials and spin-on glass materials (SOG materials). Accordingly, the surface of the interlayer insulating layer 133 is planarized. The interlayer insulating layer 133 is preferably a planarizing film which conducts planarization. In addition, as with the interlayer insulating layer 132, the resin material and the SOG material preferably has photosensitivity in order to facilitate the formation of the connection hole (more specifically, through hole 143). The interlayer insulating layer 133 may have a structure in which a plurality of insulating layers formed with a resin material and/or SOG material are laminated. Or alternatively, as with the interlayer insulating layer 132, the interlayer insulating layer 133 may have a structure in which an insulating layer (planarizing film) formed with at least one of a resin material and a SOG material, and an insulating layer (e.g. inorganic insulating film) formed by CVD method, sputtering method or the like are laminated. It is preferable that the surface of the interlayer insulating layer 133 is substantially flat. However, as with the interlayer insulating layer 132, it may have level difference of about 500 nm (preferably 200 nm) or less in height. In such a case, the curvature radius is preferably larger than the height of level difference.

After that, photolithography is carried out to form the through hole 143 in the interlayer insulating layer 133. Accordingly, the upper connection wiring 108 is partially exposed. At this time, the through hole 143 is positioned so as to overlap with the gate electrode 104. The size of the through hole 143 can be appropriately set and is normally 2 to 5 μm/side and preferably 4 μm/side when the planer shape (shape in a plan view of the main face of the substrate 101) of the through hole 143 is substantially a square.

Finally, a transparent conductive film having a thickness of 80 to 120 nm (Preferably 100 to 110 nm) is formed by sputtering method. Then, the transparent conductive film is patterned into a desired shape by photolithography so as to produce the pixel electrode 105. In this manner, the pixel electrode 105 is electrically connected to the upper connection wiring 108 through the through hole 143. The material of the pixel electrode 105 is preferably indium tin oxide (ITO).

According to the substrate 100 for display device of the present embodiment, the through hole 142 is overlapping with the contact hole 141a in a plan view of the main face of the substrate 101 so as to reduce the area of the wiring layer. In this manner, the area of the non-opening part h is reduced so that the aperture ratio is improved. In addition, the lower connection wiring 107 is not overlapping with the gate electrode 104 in a plan view of the main face of the substrate 101 and the upper connection wiring 108 is positioned on the through hole 142 toward the gate electrode 104. This can reduce the area of the wiring layer while suppressing the parasitic capacitance between the conductors having different electric potentials. As a result, it is possible to further reduce the area of the wiring layer while preventing property deterioration due to the parasitic capacitance, such as signal delay in the wiring, inappropriate signal writing, and increase in power consumption. This further reduces the area of the non-opening part h and improves the aperture ratio. In addition, the upper connection wiring 108 is overlapping with the gate electrode 104 in a plan view of the main face of the substrate 101, which further reduces the area of the wiring layer. This further reduces the area of the non-opening part h and improves the aperture ratio. The substrate 100 for display device provided with the pixel electrode 105 exerts the above effects and allows further lamination of conductive layers.

It is to be noted that the upper connection wiring 108 may not be overlapping with the gate electrode 104 in the present embodiment. FIG. 4 is a schematic cross-sectional view illustrating another substrate for display device of Embodiment 1. In FIG. 4, allocation of the number is omitted with regard to members not used in the description.

As illustrated in FIG. 4, when the distance between the gate electrode 104 and the contact hole 141a is long, the upper connection wiring 108 in the wiring layer 123 may be positioned so as not to overlap with the gate electrode 104 in the wiring layer 121 in a plan view of the main face of the substrate 101. This can further suppress the parasitic capacitance (fringing capacitance) between the upper connection wiring 108 and the gate electrode 104. Therefore, it is possible to reduce the area of the wiring layer while preventing property deterioration due to the parasitic capacitance, such as signal delay in the wiring, inappropriate signal writing, and increase in power consumption.

Embodiment 2

FIG. 5 are schematic views each illustrating a substrate for display device of Embodiment 2. FIG. 5(a) is a plan view of the substrate and FIG. 5(b) is a cross-sectional view of the substrate taken along X2-Y2 line in FIG. 5(a).

A substrate 200 for display device of Embodiment 2 is a substrate for display device to be used in a display device such as a liquid crystal display device. As illustrated in FIGS. 5(a) and 5(b), the substrate 200 for display device comprises a semiconductor layers 202n and 202p, a gate insulating layer 203, a wiring layer 221, an interlayer insulating layer 231, an interlayer insulating layer 232, a wiring layer 223, an interlayer insulating layer 233, and a wiring layer 224 laminated in this order on a main face of the substrate 201.

The semiconductor layers 202n and 202p are the first conductive layers laminated on the substrate 201. The gate insulating layer 203 is the first insulating layer laminated on the substrate 201. The wiring layer 221 is the second conductive layer laminated on the substrate 201. The interlayer insulating layer 231 is the second insulating layer laminated on the substrate 201 and comprises contact holes 241a, 241b, 241c, and 241d. The wiring layer 222 is the third conductive layer laminated on the substrate 201. The interlayer insulating layer 232 is the third insulating layer laminated on the substrate 201 and comprises through holes 242a and 242b. The wiring layer 223 is the third conductive layer laminated on the substrate 201. The interlayer insulating layer 233 is the fourth insulating layer laminated on the substrate 201 and comprises a through hole 243. The wiring layer 224 is the fourth conductive layer laminated on the substrate 201.

The substrate 200 for display device comprises a CMOS transistor 211 including a N-channel type thin film transistor (Nch-TFT) 210n and a P-channel type thin film transistor (Pch-TFT) 210p. The CMOS transistor 211 constitutes an inverter circuit included in a peripheral circuit portion. The Nch-TFT 210n comprises a semiconductor layer 202n, a gate insulating layer 203, a gate electrode 204n formed on a channel region 202na in the wiring layer 221. On the other hand, the Pch-TFT 210p comprises a semiconductor layer 202p, a gate insulating layer 203, a gate electrode 204p formed on a channel region 202pa in the wiring layer 221. As above described, the Nch-TFT 210n and the Pch-TFT 210p are top-gate type (planer type) TFTs each having a single drain structure. From the standpoint of reducing the off-state current, the Nch-TFT 210n and the P-ch TFT 210p may have LOS structures or Gold structures.

The gate electrodes 204n and 204p and an input signal line 209 are formed in the wiring layer 221. In the substrate 200 for display device, each of the gate electrodes 204n and 204p corresponds to the first conductor of the present invention. The gate electrodes 204n and 204p are electrically connected to each other through the input signal line 209. The gate electrodes 204n and 204p and the input signal line 209 are integrally formed in the wiring layer 221. Each of the gate electrodes 204n and 204p has a width in the channel length direction of about 1 to 10 µm. In addition, the input signal line 209 has a width of about 1 to 100 µm.

In the substrate 200 for display device, the gate electrode 204n in the wiring layer 221 is in the region overlapping the channel region 202na included in the Nch-TFT 210n. Further, the gate electrode 204n in the wiring layer 221 is in the region overlapping the channel region 202pa included in the Pch-TFT 210p.

The wiring layer 222 comprises a lower connection wirings (lower wirings) 206n and 206p and an output signal line 251. In the substrate 200 for display device, each of the lower connection wirings 206n and 206p corresponds to the second conductor of the present invention. The lower connection wiring 206n is electrically connected to a high-concentration impurity region 202nc through the contact hole 241a. Further, the lower connection wiring 206p is electrically connected to a high-concentration impurity region 202pc through the contact hole 241d.

The wiring layer 223 comprises a low-voltage power supply wiring (upper wiring) Vss and the upper connection wiring (upper wiring) 208. In the substrate 200 for display device, each of the low-voltage power supply wiring Vss and the upper connection wiring 208 corresponds to the third conductor of the present invention. The low-voltage power supply wiring Vss is electrically connected to a source region (high-concentration impurity region 220nc) of the Nch-TFT 210n through the through hole 242a, the lower connection wiring 206n, and the contact hole 241a. Here, the low-voltage power supply wiring Vss has a width of about 3 to 200 µm (preferably 8 to 100 µm). In addition, the upper connection wiring 208 is electrically connected to a source region (high-concentration impurity region 220pc) of the Pch-TFT 210p through the through hole 242b, the lower connection wiring 206p, and the contact hole 241d.

The wiring layer 224 comprises a high-voltage power supply wiring Vdd. In the substrate 200 for display device, the high-voltage power supply wiring Vdd corresponds to the fourth conductor of the present invention. In addition, the high-voltage power supply wiring Vdd is electrically connected to the source region (high-concentration impurity region 202pc) of the Pch-TFT 210p through the through hole 243, the upper connection wiring 208, the through hole 242b, the lower connection wiring 206p, and the contact hole 241d. The high-voltage power supply wiring Vdd has a width of about 5 to 200 µm (preferably 8 to 100 µm).

A drain region (high-concentration impurity region 202nb) of the Nch-TFT 210n is electrically connected to an output signal line 251 through the contact hole 241c. In addition, a drain region (high-concentration impurity region 202pb) of the Pch-TFT 210p is electrically connected to the output signal line 251 through the contact hole 241c. As above, the drain region (high-concentration impurity region 202nb) of the Nch-TFT 210n is electrically connected to the drain region (high-concentration impurity region 202pb) of the Pch-TFT 210p through the output signal line 251.

The contact hole 241*a* is a connection hole penetrating the interlayer insulating layer 231 and the gate insulating layer 203 to electrically connect the lower connection wiring 206*n* to the high-concentration impurity region 202*nc*. The contact holes 241*b* and 241*c* are connection holes penetrating the interlayer insulating layer 231 and the gate insulating layer 203 to electrically connect the high-concentration impurity region 202*nb* to the high-concentration impurity region 202*pb* through the output signal line 251. The contact hole 241*d* is a connection hole penetrating the interlayer insulating layer 231 and the gate insulating layer 203 to electrically connect the lower connection wiring 206*p* to the high-concentration impurity region 202*pc*. The through hole 242*a* is a connection hole penetrating the interlayer insulating layer 232 to electrically connect the low-voltage power supply wiring Vss to the lower connection wiring 206*n*. The through hole 242*b* is a connection hole penetrating the interlayer insulating layer 232 to electrically connect the upper connection wiring 208 to the lower connection wiring 206*p*. The through hole 243 is a connection hole penetrating the interlayer insulating layer 233 to electrically connect the high-voltage power supply wiring Vdd to the upper connection wiring 208. In the substrate 200 for display device, each of the contact holes 241*a* and 241*d* corresponds to the first connection hole of the present invention. Each of the through holes 242*a* and 242*b* corresponds to the second connection hole of the present invention. The through hole 243 corresponds to the third connection hole of the present invention.

In the substrate 200 for display device, a signal inputted to the input signal line 209 turns any of the Nch-TFT 210*n* and the Pch-TFT 210*p* on. When the Nch-TFT 210*n* is turned on, a signal transmitted from the low-voltage power supply wiring Vss passes through the lower connection wiring 206*n*, the Nch-TFT 210*n* (channel region 202*na* and high-concentration impurity regions 202*nb* and 202*nc*), and the output signal line 251 in this order. Accordingly, the electric potential of the gate electrode 204*n* electrically connected to the input signal line 209 is normally different from the electric potentials of the low-voltage power supply wiring Vss, the lower connection wiring 206*n*, and the output signal line 251. When the Pch-TFT 210*p* is turned on, a signal transmitted from the high-voltage power supply wiring Vdd passes through the upper connection wiring 208, the lower connection wiring 206*p*, the Pch-TFT 210*p* (channel region 202*p* and high-concentration impurity regions 202*pb* and 202*pc*), and the output signal line 251 in this order. Accordingly, the electric potential of the gate electrode 204*p* is normally different from the electric potentials of the high-voltage power supply wiring Vdd, the upper connection wiring 208, the lower connection wiring 206*p*, and the output signal line 251.

A production method of a wiring substrate 200 is described in the following.

First, a substrate 201 is prepared which is similar to the substrate 101 of Embodiment 1. A foundation layer may be formed here in the same manner as in Embodiment 1.

Next, insular semiconductor layers 202*n* and 202*p* each having a thickness of 30 to 100 nm (preferably 40 to 50 nm) are formed. More specifically, an amorphous semiconductor film having an amorphous structure is formed by a known method (sputtering method, LPCVD method, plasma CVD method and the like) and the obtained film is crystallized by a known method (laser crystallization, heat crystallization, heat crystallization with use of a catalyst such as nickel) so as to produce a crystalline semiconductor film. The crystalline semiconductor film is patterned into a desired shape by photolithography. Each of the semiconductor layers 202*n* and 202*p* is formed in this manner. The material of each of the semiconductor layers 202*n* and 202*p* is not especially limited and is preferably silicon, a silicon-germanium (SiGe) alloy, or the like.

Next, the gate insulating layer 203 having a thickness of 30 to 100 nm (preferably 50 to 70 nm) is formed in the same manner as in Embodiment 1. Then, in order to control the threshold voltages of the Nch-TFT 210*n* and the Pch-TFT 210*p*, the entire surface of the semiconductor layers 202*n* and 202*p* is doped with impurity elements such as boron (B) by ion implantation under the conditions of 50 kV, $5 \times 10^{12}$ to $3 \times 10^{13}$ cm$^{-2}$. The concentration of the impurity elements in the semiconductor layers 202*n* and 202*p* is to be about $5 \times 10^{16}$ to $5 \times 10^{17}$ cm$^{-3}$.

In addition, when making the Nch-TFT 210*n* into GOLD structure, the semiconductor layer 202*n* is doped with impurity elements, such as phosphorus (P), by ion implantation with the channel region 202*na* and the semiconductor layer 202*p* in the semiconductor layer 202*n* masked with resists, under the conditions of 70 kV, $1 \times 10^{13}$ to $1 \times 10^{14}$ cm$^{-2}$ (low concentration doping). The concentration of the impurity elements in the semiconductor layer 202*n* is to be about $1 \times 10^{17}$ to $1 \times 10^{18}$ cm$^{-3}$. After that, the resists are removed.

Next, the wiring layer 221 having a thickness of 200 to 600 nm (preferably 300 to 400 nm) is formed in the same manner as in Embodiment 1. Accordingly, the gate electrodes 204*n* and 204*p*, and the input signal line 209 are formed.

Next, the semiconductor layers 202*n* and 202*p* are doped with impurities, such as phosphorus (P) to Nch, and Boron (B) to Pch, by ion implantation self-aligningly with use of the wiring layer 221 as a mask under the conditions of 50 kV, $5 \times 10^{15}$ to $1 \times 10^{16}$ cm$^{-2}$ (high concentration, doping). The concentration of the impurity elements in the semiconductor layers 202*n* and 202*p* is to be about $1 \times 10^{19}$ to $1 \times 10^{20}$ cm$^{-3}$. In this manner, the high-concentration impurity regions 202*nb*, 202*nc*, 202*pb*, and 202*pc* are formed, each of which functions as the source region or the drain region. When making the Nch-TFT 210*n* into LDD structure, low concentration doping of impurities such as phosphorus (P) is carried out to the semiconductor layer 202*n* with use of the wiring layer 221 as a mask prior to the high concentration doping. In this manner, a low-concentration impurity region functioning as a LDD region is formed, and then, the low-concentration impurity region is masked with a resist. Subsequently, high concentration doping is carried out, and thereafter, the resist is removed.

Next, in the same manner as in Embodiment 1, the interlayer insulating layer 231 having a thickness of 0.5 to 1.5 μm (preferably 0.7 to 1.0 μm) is formed and the semiconductor layers 202*n* and 202*p* are hydrogenated and activated. The interlayer insulating layer 231 is preferably a laminated layer comprising a hydrogen-containing silicon nitride (SiN:H) film and a SiO$_2$ film laminated in this order on the wiring layer 221, as with the interlayer insulating layer 131 in Embodiment 1. After that, photolithography is carried out so as to form the contact holes 241*a*, 241*b*, 241*c*, and 241*d* in the interlayer insulating layer 231 and the gate insulating layer 203. Accordingly, the source region and the drain region of the Nch-TFT 210*n* and the Pch-TFT 210*p* are partially exposed.

Next, in the same manner as in Embodiment 1, the wiring layer 222 having a thickness of 400 to 1000 nm (preferably 600 to 800 nm) is formed. In this manner, the lower connection wirings 206*n* and 206*p*, and the output signal line 251 are formed. The lower connection wiring 206*n* is electrically connected to the source region (high-concentration impurity region 202*nb*) of the Nch-TFT 210*n* through the contact hole 241*a*. Here, the lower connection wiring 206*n* is positioned so as not to overlap with the gate electrode 204n in a plan view of the main face of the substrate 201. In addition, the lower connection wiring 206p is electrically connected to the source region (high-concentration impurity region pc) of the Pch-TFT 210p through the contact hole 241d. Here, the lower connection wiring 206p is positioned so as not to overlap with the gate electrode 204p in a plan view of the main face of the substrate 201. In addition, the output signal line 251 is electrically connected to the drain region (high-concentration impurity region 202nb) of the Nch-TFT 210n through the contact hole 241b and to the drain region (high-concentration impurity region 202pb) of the Pch-TFT 210p through the contact hole 241c. Accordingly, the Nch-TFT 210n and the Pch-TFT 210p are electrically connected to form the CMOS transistor 211. Since the heat treatment is not needed subsequent to the above processing, the wiring layer 222 may be formed with use of a low-melting material. Accordingly, preferable materials of the wiring layer 222 include a low resistance metal such as Al, Ti, Mo, Cu, and Ag, and a metal alloy or compound mainly comprising the low resistance metal, as in Embodiment 1. Here, the wiring layer 222 may have a laminated structure of the conductive films formed by these materials.

Next, in the same manner as in Embodiment 1, an interlayer insulating layer 232 having a thickness of 1.0 to 3.0 μm (preferably 1.5 to 2.5 μm) is formed. The interlayer insulating layer 232 is a planarizing film which conducts planarization, as with the interlayer insulating layer 132 in Embodiment 1. In addition, the interlayer insulating layer 232 is set to be thicker than the interlayer insulating layer 231. After that, photolithography is carried out to form through holes 242a and 242b in the interlayer insulating layer 232. Accordingly, the lower connection wiring 206n and 206p are partially exposed. Here, the through hole 242a is positioned in a manner that the through hole 242a overlaps with the contact hole 241a and the through hole 242b overlaps with the contact hole 241d in a plan view of the main face of the substrate 201.

Next, in the same manner as in Embodiment 1, the wiring layer 223 having a thickness of 400 to 1000 nm (preferably 600 to 800 nm) is formed. Accordingly, the low-voltage power supply wiring Vss and the upper connection wiring 208 are formed. In addition, the low-voltage power supply wiring Vss is electrically connected to the lower connection wiring 206n through the through hole 242a. Further, the upper connection wiring 208 is electrically connected to the lower connection wiring 206p through the through hole 242b. Here, the low-voltage power supply wiring Vss is positioned on the through hole 242b toward the gate electrode 104. The wiring layer 223 may be formed with use of a low-melting material, as with the wiring layer 222. Accordingly, preferable materials of the wiring layer 223 include a low resistance metal such as Al, Ti, Mo, Cu, and Ag, and a metal alloy or compound mainly comprising the low resistance metal. Here, the wiring layer 223 may have a laminated structure of the conductive films formed with these materials.

Next, in the same manner as in Embodiment 1, the interlayer insulating layer 233 having a thickness of 1.0 to 3.0 μm (preferably 1.5 to 2.0 μm) is formed. The interlayer insulating layer 233 is a planarizing film which conducts planarization, as with the interlayer insulating layer 133 in Embodiment 1. In addition, the interlayer insulating layer 233 is set to be thicker than the interlayer insulating layer 231. After that, photolithography is carried out to form a through hole 243 in the interlayer insulating layer 233. Accordingly, the upper connection wiring 208 is partially exposed. Here, the through hole 243 is positioned so as to overlap with the gate electrode 204p in a plan view of the main face of the substrate 201.

Finally, a conductive film having a thickness of 400 to 1000 nm (Preferably 600 to 800 nm) is formed by sputtering method. Then, the conductive film is patterned into a desired shape by photolithography so as to produce the wiring layer 224. In this manner, the high-voltage power supply wiring Vdd is formed. In addition, the high-voltage power supply wiring Vdd is electrically connected to the upper connection wiring 208 through the through hole 243. The wiring layer 224 may be formed with use of a low-melting material, as with the wiring layer 222. Accordingly, preferable materials of the wiring layer 224 include a low resistance metal such as Al, Ti, Mo, Cu, and Ag, and a metal alloy or compound mainly comprising the low resistance metal. Here, the wiring layer 224 may have a laminated structure of the conductive films formed with these materials.

According to the substrate 200 for display device of the present embodiment, the through holes 242a and 242b are respectively overlapping with the contact holes 241a and 241d in a plan view of the main face of the substrate 201. This reduces the area of the wiring layer. In this manner, the area of the peripheral circuit portion is reduced, resulting in the frame narrowing. In addition, the lower connection wirings 206n and 206p are not overlapping with the gate electrodes 204n and 204p in a plan view of the main face of the substrate 201. Further, the low-voltage power supply wiring Vss is positioned on the through hole 242a toward the gate electrode 204n and the upper connection wiring 208 is positioned on the through hole 242b toward the gate electrode 204p. This reduces the area of the wiring layer while suppressing the parasitic capacitance between the conductors having different electric potentials. As a result, it is possible to further reduce the area of the wiring layer while suppressing the property deterioration due to the parasitic capacitance, such as signal delay in the wiring, inappropriate signal writing, and increase in power consumption. In this manner, the area of the peripheral circuit portion is further reduced, resulting in the further frame narrowing. Moreover, the high-voltage power supply wiring Vss and the upper connection wiring 208 respectively overlapping with the gate electrodes 204n and 204p in a plan view of the main face of the substrate 201 leads to the further reduction in the area of the wiring layer. This further reduces the area of the peripheral circuit portion, resulting in the further frame narrowing. Accordingly, the substrate 200 for display device of the present embodiment is suitably used as a full-monolithic substrate for display device. The substrate 200 for display device provided with the high-voltage power supply wiring Vdd allows further lamination of wiring layers while exerting the above effects.

As above, the present invention has been described in Embodiments 1, 2 with reference to the pixel portion and the peripheral circuit portion of the substrate for display device. However, the present invention is not limited to this and may be used in a semiconductor device comprising a MOS transistor formed in an integrated circuit. In such a case, The Nch-TFT 210n and the Pch-TFT 210p are employed as MOS transistors included in an integrated circuit, and the similar configuration as that of the substrate 200 for display device illustrated in FIG. 5 may be employed with respect to other members. In this manner, it is possible to downsize the integrated circuit while preventing property deterioration due to the parasitic capacitance, and therefore, the integration degree of the integrated circuit is enhanced. In addition, it is possible to obtain a compact and high-performance semiconductor device that is less likely to have signal delay in the wiring and inappropriate signal writing and is excellent in power conservation.

The present application claims priority to Patent Application No. 2008-116177 filed in Japan on Apr. 25, 2008 under the Paris Convention and provisions of national law in a designated State, the entire contents of which are hereby incorporated by reference.

BRIEF DESCRIPTION OF THE SEVERAL VIEWS OF THE DRAWINGS

FIG. 1(a) is a plan view of the substrate and FIG. 1(b) is a cross-sectional view of the substrate taken along X1-Y1 line in FIG. 1(a).

FIG. 5(a) is a plan view of the substrate and FIG. 5(b) is a cross-sectional view of the substrate taken along X2-Y2 line in FIG. 5(a).

Figure 1:
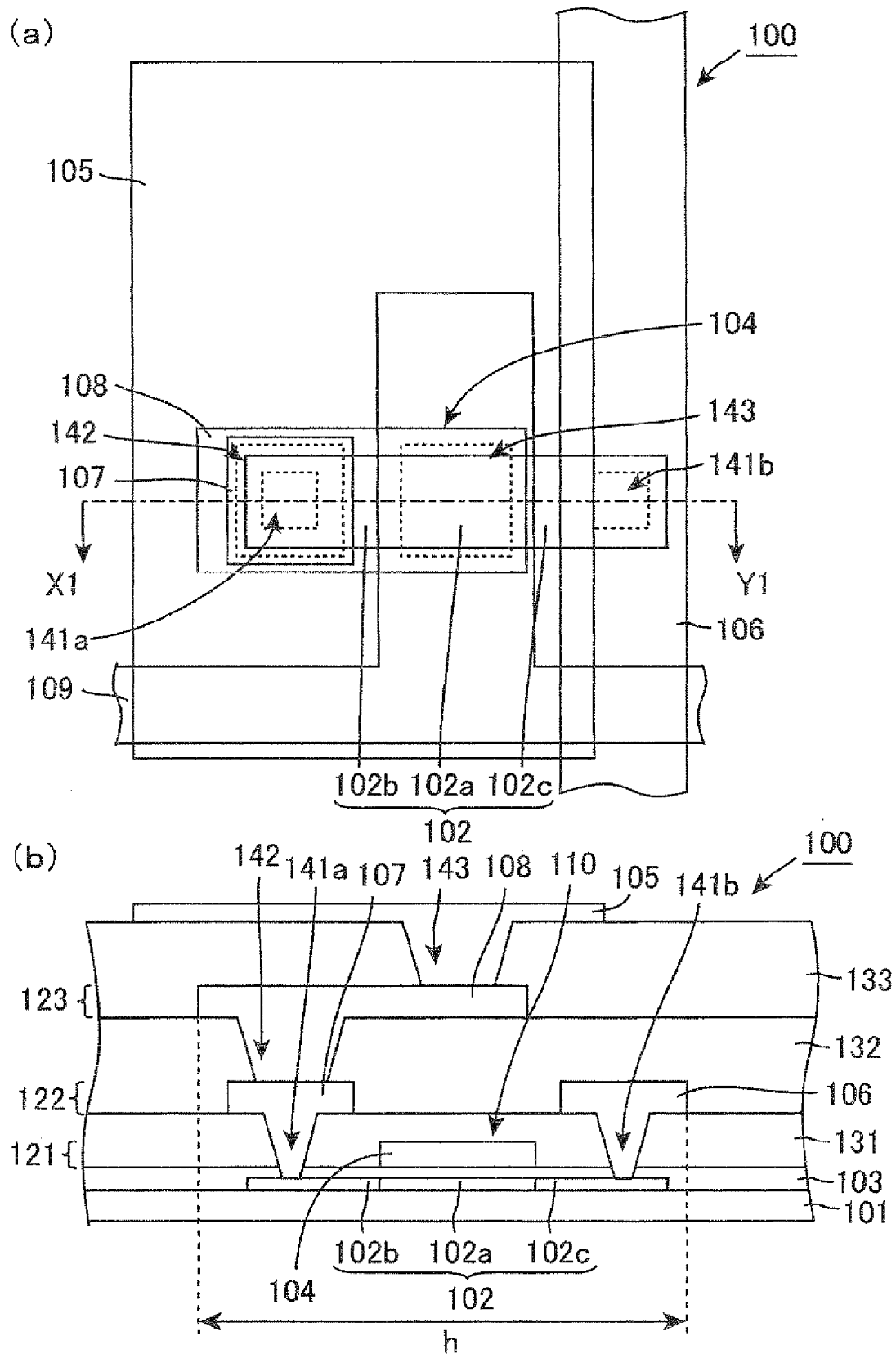
FIG. 1 are schematic views each illustrating a substrate for display device of Embodiment 1.
Figure 2:
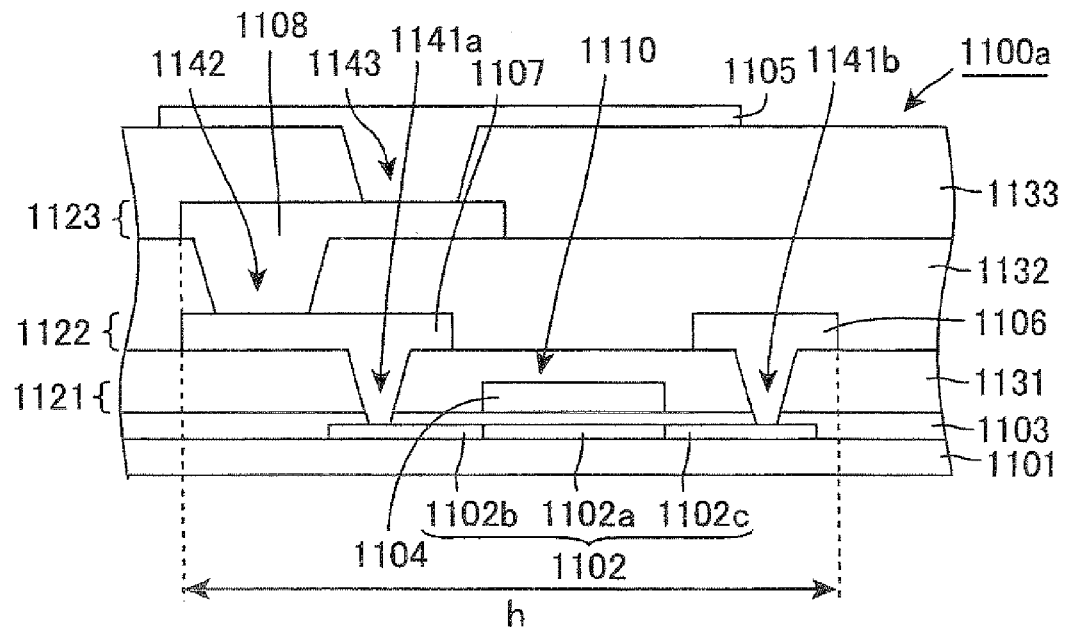
FIG. 2 is a schematic cross-sectional view illustrating a conventional substrate for display device.
Figure 3:
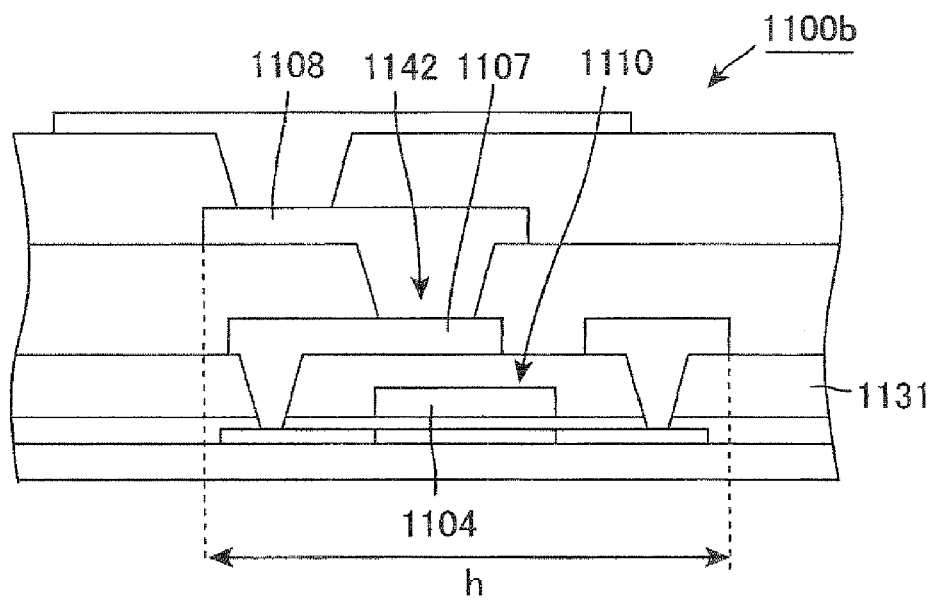
FIG. 3 is a schematic cross-sectional view illustrating a modification of the conventional substrate for display device.
Figure 4:
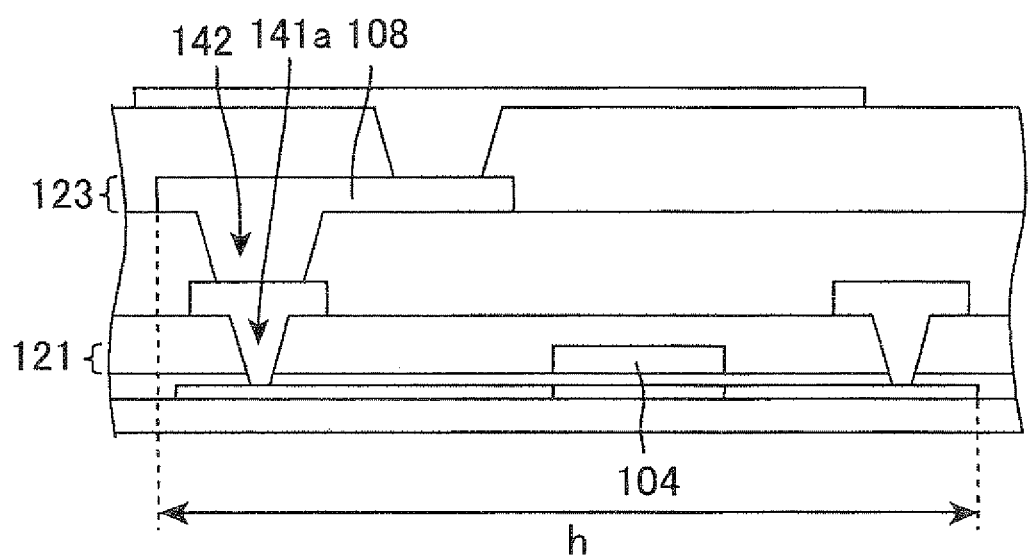
FIG. 4 is a schematic cross-sectional view illustrating another substrate for display device of Embodiment 1.
Figure 5:
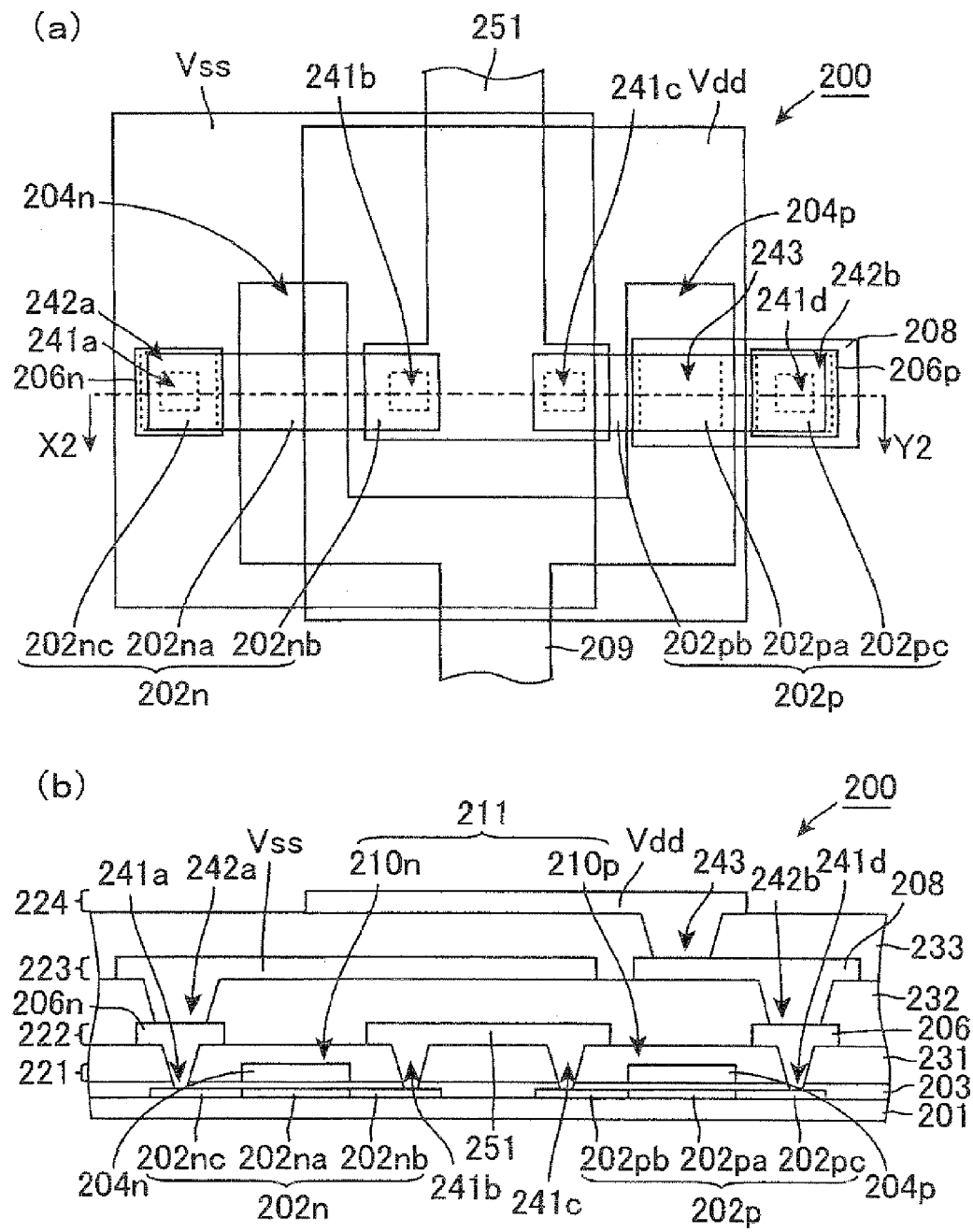
FIG. 5 are schematic views illustrating a substrate for display device of Embodiment 2.

EXPLANATION OF REFERENCES 100, 200, 1100a, 1100b: Substrate for display device
101, 201, 1101: Substrate
102, 202n, 202p, 1102: Semiconductor layer
102a, 202na, 202pa, 1102a: Channel region
102b, 102c, 202nb, 202nc, 202pb, 202pc, 1102b, 1102c: High-concentration impurity region
103, 203, 1103: Gate insulating layer
104, 204n, 204p, 1104: Gate electrode
105, 205, 1105: Pixel electrode
106, 1106: Source wiring
107, 206n, 206p, 1107: Lower connection wiring (Lower wiring)
108, 208, 1108: Upper connection wiring (Upper wiring)
109: Gate wiring
209: Input signal line
110, 1110: Pixel transistor
210n: N-channel type thin film transistor (Nch-TFT)
210p: P-channel type thin film transistor (Pch-TFT)
211: CMOS transistor
121, 122, 123, 221, 222, 223, 224, 1121, 1122, 1123: Wiring layer
131, 132, 133, 231, 232, 233, 1131, 1132, 1133: Interlayer insulating layer
141a, 141b, 241a, 241b, 241c, 241d, 1141: Contact hole
142, 143, 242a, 242b, 243, 1142, 1143: Through hole
251: Output signal line
h: Non-opening part
Vdd: High-voltage power supply wiring
Vss: Low-voltage power supply wiring (Upper wiring)

The invention claimed is:

1. A multilayer wiring comprising:
a plurality of insulating layers each having a connection hole;
a plurality of conductive layers; and
a substrate having the plurality of insulating layers and the plurality of conductive layers alternately laminated on a main face of the substrate,
wherein the multilayer wiring includes:
a first conductor positioned in a (n+1)th conductive layer laminated on the substrate;
a second conductor positioned in a (n+2)th conductive layer laminated on the substrate, electrically connected to a conductor in a layer below the (n+1)th conductive layer through at least a first connection hole in a (n+1)th insulating layer directly below the (n+2)th conductive layer, and positioned so as not to overlap with the first conductor in a plan view of the main face of the substrate; and
a third conductor positioned in a (n+3)th conductive layer laminated on the substrate, electrically connected to a second conductor through a second connection hole in a (n+2)th insulating layer directly below the (n+3)th conductive layer, and positioned on the second connection hole toward the first conductor, the second connection hole overlapping with the first connection hole in a plan view of the main face of the substrate,
n referring to an arbitrary natural number;
which further comprises a fourth conductor positioned in a (n+4)th conductive layer laminated on the substrate and electrically connected to the third conductor through a third connection hole that is formed in a (n+3)th insulating layer directly below the (n+4)th conductive layer and is positioned closer to the first conductor than the second connection hole is in a plan view of the main face of the substrate.

2. The multilayer wiring according to claim 1,
wherein the third conductor overlaps with the first conductor in a plan view of the main face of the substrate.

3. The multilayer wiring according to claim 1,
wherein the third conductor does not overlap with the first conductor in a plan view of the main face of the substrate.

4. The multilayer wiring according to claim 1,
wherein an electric potential of the first conductor is different from an electric potential of the third conductor.

5. A semiconductor device comprising
the multilayer wiring according to claim 1 and a MOS transistor,
wherein the first conductor is a gate electrode of the MOS transistor;
the second conductor is a lower wiring electrically connected to a source drain region of the MOS transistor through a first connection hole, the source drain region positioned below the gate electrode; and
the third conductor is an upper wiring electrically connected to a lower wiring through a second connection hole.

6. A substrate for display device comprising the semiconductor device according to claim 5,
wherein the MOS transistor is a thin film transistor to be used in a pixel portion.

7. A substrate for display device comprising the semiconductor device according to claim 5,
wherein the MOS transistor is a thin film transistor to be used in a peripheral circuit portion.

8. A display device comprising
the substrate for display device according to claim 6.

9. The semiconductor device according to claim 5,
wherein the MOS transistor is formed in an integrated circuit.

10. A display device comprising
the semiconductor device according to claim 9.

* * * * *